United States Patent [19]
Bayer et al.

[11] Patent Number: 5,935,739
[45] Date of Patent: Aug. 10, 1999

[54] MANUFACTURING METHOD FOR MEMBRANE LITHOGRAPHY MASK WITH MASK FIELDS

[75] Inventors: Thomas Bayer, Aidlingen-Dachtel; Johann Greschner, Pliezhausen; Samuel Kalt, Reutlingen; Klaus Meissner, Herrenberg-Kayh, all of Germany; Hans Pfeiffer, Ridgefield, Conn.

[73] Assignee: International Business Machines Corporation, Armonk, N.Y.

[21] Appl. No.: 09/040,100

[22] Filed: Mar. 17, 1998

[30] Foreign Application Priority Data

Mar. 17, 1997 [DE] Germany ............................ 197 10 798

[51] Int. Cl.⁶ ..................................................... G03F 9/00
[52] U.S. Cl. ................................. 430/5; 430/313
[58] Field of Search .......................... 430/5, 313

[56] References Cited

U.S. PATENT DOCUMENTS

| | | | |
|---|---|---|---|
| 5,178,977 | 1/1993 | Yamada ....................................... | 430/5 |
| 5,270,125 | 12/1993 | America ....................................... | 430/5 |
| 5,795,684 | 8/1998 | Troccolo ....................................... | 430/5 |
| 5,798,194 | 8/1998 | Nakasuji ....................................... | 430/5 |

*Primary Examiner*—Christopher G. Young

[57] ABSTRACT

The invention relates to a manufacturing method for a membrane mask suitable for particle beams with mask fields, which are bounded by thin support walls.

The deep plasma etching for the formation of the support walls is halted shortly before reaching the membrane and the last μm before the membrane removed by wet-chemical etching. A high etch selectivity can be achieved using an alkaline etching solution.

The support walls 1 are turned by 45° to the (110) direction or oriented parallel to the (100) plane, so that the structures restricted by (111) planes are avoided.

11 Claims, 4 Drawing Sheets

MANUFACTURING METHOD FOR MEMBRANE LITHOGRAPHY MASK WITH MASK FIELDS

TECHNICAL FIELD OF THE INVENTION

The invention relates to a manufacturing method for a membrane lithography mask with mask fields are bounded by thin support walls. The membrane mask is suitable for exposure procedures using particle beams such as electron beams.

BACKGROUND OF THE INVENTION

With the increasing diminution of the structures to be reproduced, advanced exposure procedures, which include X-ray beam, electron-beam and ion-beam procedures, are increasingly replacing optical lithography. They are used for manufacturing exposure masks or for the direct exposure of semiconductor wafers and in the case of the structure widths aspired to of only approx. 0.2 $\mu$m in the case of the 1 GBit chip generation, they will be the dominant lithography processes.

While the mask substrates for conventional optical lithography consist of relatively thick (several mm) quartz plates, which are transparent for the normal light wavelengths, it has been attempted since as the beginning of the 1970s to use membrane masks for X-ray beam, electron-beam and ion-beam procedures. This permits an adequate throughput of semiconductor wafers at a higher resolution. The interactions of these three types of short-wave radiation with the mask call for membrane masks with a thickness of roughly 0.1 $\mu$m up to several $\mu$m.

The masks for ion-beams require holes in the membrane as a pattern, while for X-ray beam and electron-beam exposure closed membranes with metal-absorber patterns can also be used.

In all these cases the membrane mask is manufactured by an electron-beam pattern generator writing the appropriate patterns in photoresist. For structures smaller than 0.5 $\mu$m, the corner quality of the patterns written using electron beams is poor and the corners are rounded.

The pattern is then transferred to the membrane or the absorber layer by etching processes. The anisotropic plasma-etching processes mostly used are distinguished by exact pattern transfer, i.e. the corners which are already rounded in the photoresist are transferred to the membrane as rounded corners of almost identical dimensions.

Shadow masks, or hole masks, as shown in FIG. 4, in which the pattern consists of physical holes and which are described for example in European patents EP 0 019 779 or EP 0 078 336, have been realized hitherto exclusively using a membrane 10 of silicon.

In the case of the shadow or stencil mask in EP 0 019 779, the n-doped silicon substrate has a p-doped surface layer, the membrane, which is coated with a thin chromium layer and two gold layers applied over it. This gold layer, which is typically several hundred nm (approx. 1 $\mu$m maximum) thick in total, was used to stop the electrons in the impermeable mask areas.

The membrane thicknesses are in the region of roughly 1 to 4 $\mu$m, typically 2 $\mu$m. Silicon membranes of this kind can be manufactured uniformly with the use of a doping etch stop of boron. As structure sizes become smaller and membrane thickness decreases, the demands on anisotropic plasma etching become ever greater and an extremely high p-doping is required as a doping etch stop, e.g. boron doping of approximately $1.3 \times 10^{20}$ boron atoms/cm$^3$. Silicon membranes with this degree of etch-stop doping display a high number of misalignment faults and mechanically are extremely fragile.

In masks with a closed or continuous membrane for X-ray beam lithography, as shown in FIG. 5, the pattern is produced in the form of a structured metal absorber material 21 on the continuous membrane 20. In order for the membrane to be transparent to X-ray beams, it should be only a few $\mu$m thick and the membrane material should have an atomic number that is as small as possible, in order to absorb as little radiation as possible at the "transparent" areas.

The absorber material is also only a few $\mu$m thick and has as high an atomic number as possible. Typical metal absorbers consist of tungsten or gold and for membrane materials such as silicon, silicon nitride, silicon carbide, a silicide as proposed in EP 0 048 291 or recently also diamond have been selected.

The base for the membrane is a silicon wafer 22, which due to anisotropic etching has at least one opening going right through, the side walls of which consist of (111) planes and are inclined at 54.7° to the (100) surface of the silicon wafer.

With these masks, the problem of mask distortions caused by uneven mechanical stress in the membrane has not been solved satisfactorily to date. Mechanical distortions can be caused both by the membrane material itself and by the absorber material. In addition, the difficulty exists of structuring the metal absorber material by means of reactive ion etching in the submicron range.

A few years ago, an electron-beam projection process was proposed by S. D. Berger et al. In J.Vac.Sci.Technol. B9(6), November/December 1991, p. 2996–2999, "Projection electron-beam lithography: A new approach" which uses high-energy electrons and called for a new membrane mask technique. The SCALPEL™ mask (Scanning with Angular Limitation Projection Electron-Beam Lithography) also described by Huggins et al. in Proceedings of SPIE 1995, Vol. 2621, p. 247–255 and by J. A. Liddle et al. in Proceedings of SPIE 1994, Vol. 2322, p. 442–451 resembles the closed membrane masks used for X-ray beam lithography.

The layer thicknesses of the membrane and the metal absorber layer are smaller in the case of the SCALPEL masks. Electrons of approximately 100 keV penetrate both layers, but are scattered to a different extent in the different layers.

In contrast to the membrane masks used for X-ray beam lithography, the SCALPEL mask is divided into smaller mask fields. This division permits support walls, which provide a better mechanical and thermal stability. To keep the area loss between the mask fields to a minimum, the thin support walls are disposed perpendicular to the wafer surface and have been produced by anisotropic wet-etching from a (110) wafer.

Similarly to X-ray beam lithography masks, stress problems occur in the SCALPEL masks due to the membrane and/or the metal absorber layer. In the masks described inter alia in Proceedings of SPIE 1995, Vol. 2621, p.247–255, the mask fields are long narrow strips, so that the unsupported membrane parts consist of rectangles of approximately 1 mm×2 cm in size. Since the membranes must be under tensile stress, different tensile stresses occur in the x- and y-direction, leading to an anisotropic distortion of the mask pattern.

U.S. Pat. No. 5,260,151 shows SCALPEL masks with square mask fields of approximately 1 mm edge length, in which the 0.1 mm thick and 1.0 mm high support walls delimiting the mask fields from one another are disposed perpendicular to the membrane of polycrystalline silicon. An isotropic stress distribution is thus achieved in the membrane. The manufacture of the thin, vertical support walls using anisotropic plasma etching techniques without damaging the membrane is admittedly problematic. To date, only anisotropic wet etching has been used, with the significant drawback that the support walls are at 54.7° and the walls take up as much space as the patterned part of the mask.

The art has thus sought a method of forming a reinforced mask having thin support walls.

SUMMARY OF THE INVENTION

The object of the invention consists in specifying a method for the simple and economical manufacture of masks with mask fields and thin support walls.

The invention relates to a mask having a set of subfields separated by reinforcing struts in which the crystalline structure of the struts is oriented such that the (100) direction is perpendicular to the membrane, so that the support walls are disposed exactly perpendicular to the membrane and damage to the membrane is prevented when forming the support walls.

BRIEF DESCRIPTION OF THE DRAWINGS

FIG. 1 shows, partially schematic, partially pictorial fashion, a mask with mask fields, which are bounded by thin support walls 1, in diagrammatic cross-section. The support walls consist of single-crystal silicon and are covered by a membrane 2. Typical size ratios are likewise indicated by the reference numerals in FIG. 1.

The individual mask fields have edge lengths of approximately 1 mm. The support walls are approximately 400 $\mu$m high and the thickness of membrane 2 is in the range of approximately 0.2 $\mu$m to approximately 2 $\mu$m.

Figure 1:
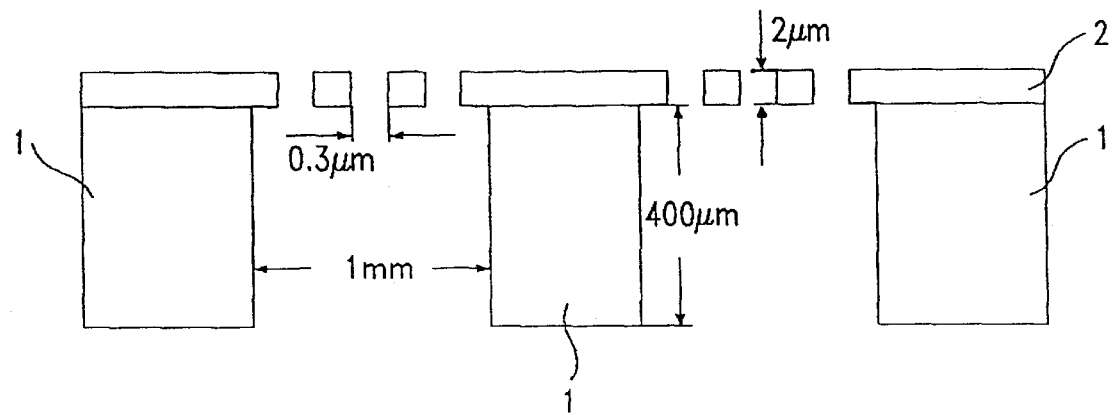
FIG. 1 shows a diagrammatic cross-section through a mask with mask fields and vertical support walls
Figure 2:
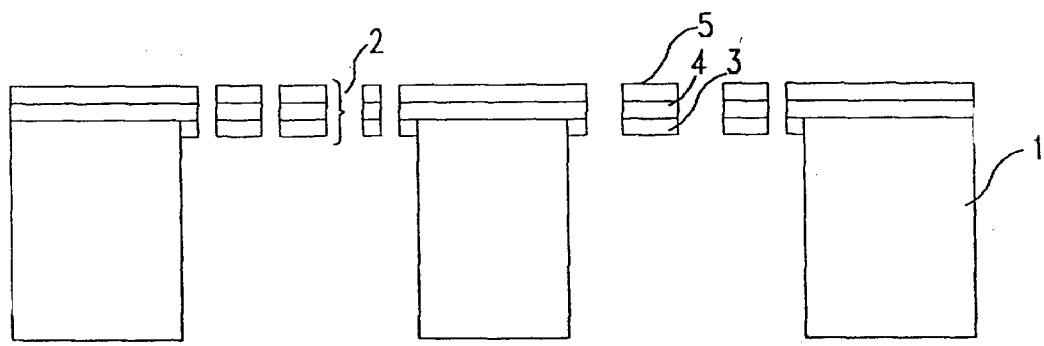
FIG. 2 shows a diagrammatic cross-section through a further preferred form of performance of the mask

Membrane 2 may consist of different materials, e.g. highly doped silicon, silicon nitride or a combined layer of $SiO_2/Si_3N_4/SiO_2$, as shown in FIG. 2, in which sub-layer 3 is $SiO_2$, sublayer 4 is $Si_3N_4$ and sublayer 5 is $SiO_2$. The example illustrated is one in which the bottom layer of oxide is deposited after the etching step to define the reinforcing walls. In a conventional process, the lower oxide layer would be grown or deposited uniformly across the wafer surface, and layer 3 in FIG. 2 would be continuous across the entire structure. The combined layer and the silicon nitride can also be covered on both sides with a heavy metal (gold, tungsten, etc.) layer about 50 nm thick, deposited at a late stage in the processing sequence.

The support walls 1 are formed by anisotropic plasma etching of the single-crystal silicon body. For this, openings roughly 400 $\mu$m deep with vertical walls are to be etched in the silicon body. Care should be taken to ensure that the thin membrane 2, which is only about 0.2 $\mu$m to 2.0 $\mu$m, is not damaged or even etched away during this deep etching. In order to perform the deep etching in a reasonable time, aggressive chemistry, such as $SF_6$ is used. In that case, no practical etch stop is present for the plasma etching and the membrane will be damaged if the etching is allowed to continue for too long. It has been found that the etch is highly non-uniform when the area to be etched is on the order of 1 $mm^2$. Thus, when the etch has reached the membrane at center, there can be as much as 250 $\mu$m of Si left in the corners of the aperture being formed. If conventional overetch procedures are followed, the membrane will be damaged. Thus, the problem addressed is that of performing an aggressive etch of a very thick Si layer, while avoiding damage to a relatively thin membrane that is not an effective etch stop.

Figure 3A:
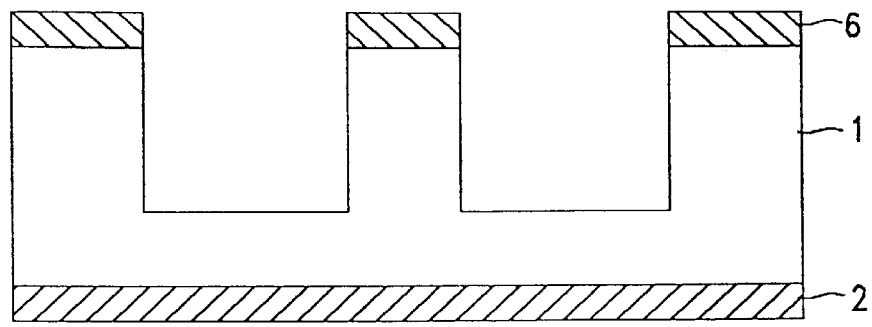
FIGS. 3a and 3b show the result of manufacturing methods for support walls known from the state of the art
Figure 3B:
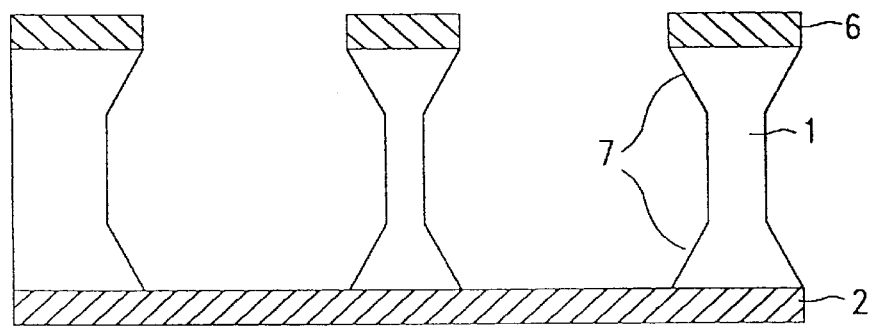

According to the invention, the plasma deep etching is a timed etch that is stopped shortly before reaching membrane 2 and the last few $\mu$m of silicon before the membrane are removed by wet-chemical etching, as can be seen in FIGS. 3a and 3b. A high etch selectivity between the low doped bulk silicon and the highly doped membrane can be achieved using an alkaline etching solution such as KOH or NaOH, etc. This wet-etching step also attacks the side walls, with a lateral etching rate that depends on the crystallographic orientation of the side walls.

In the case of an anisotropic wet etch in the prior art, the structures to be etched are oriented parallel to the (110) direction and structures bounded by (111) planes 7 in FIG. 3b are created by the wet etch. In the event of strong over-etching structures of this kind cannot be tolerated because the etch will cut through the walls.

Figure 4:
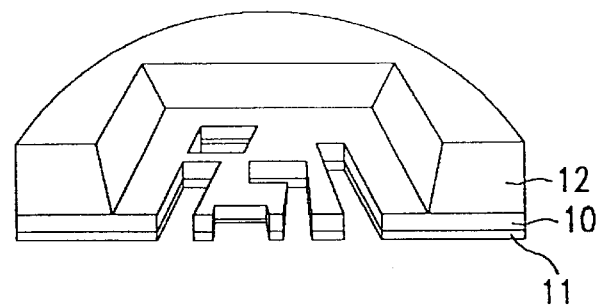
FIG. 4 is the representation of a hole mask known from the state of the art
Figure 5:
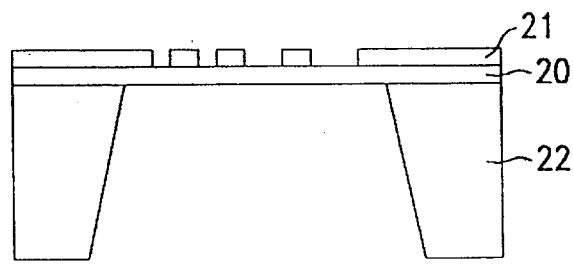
FIG. 5 is the representation of a mask known from the state of the art with a closed membrane for X-ray beam lithography

An isotropic etch is dimensionally easier to compensate for. If the support walls 1 are turned by 45° to the (110) direction, i.e. oriented parallel to the (100) plane, the structures restricted by the (111) planes 7 are avoided, although there still remains the problem of the support walls being etched through or weakened by the lateral etching. Making the walls thicker is unacceptable because it wastes too much wafer area. Referring now to FIGS. 4 and 5, there are shown portions of a wafer containing a mask field with support walls according to the prior art. The figures only show half the thickness of support walls, but it is readily apparent that the area covered by the support walls is comparable to the patterned area that is to be reproduced on the wafer.

It has been found that the adverse effect shown in FIG. 7 can be avoided. According to the invention, the anisotropic plasma etch is performed using $SF_6/O_2$ chemistry with an addition of about 5% $O_2$ to the $SF_6$. The plasma etch is stopped before the membrane is reached, leaving a remainder layer of silicon that has a thickness, referred to as a tolerance thickness, appropriate to allow for variations in the etching process. Then, an anisotropic wet etch with (KOH/Isopropyl alcohol [20% wt./saturated]) is performed. This etch not only has a very high selectivity of as much as 350:1 against the membrane (whether doped Si, nitride, or oxide), but also etches laterally at a lower rate than the etch rate in the vertical direction, although the lateral etch is substantially uniform. Thus, it is now possible to leave a substantial margin of unetched silicon after the plasma etch and to use the wet etch to remove this substantial amount of lightly doped silicon without doing unacceptable damage to the aperture walls. The mechanism that causes this effect is not completely understood, but it is believed that a thin film of oxide or another substance is formed on the walls of the deep aperture that inhibits lateral attack from the wet etch.

Figure 6A:
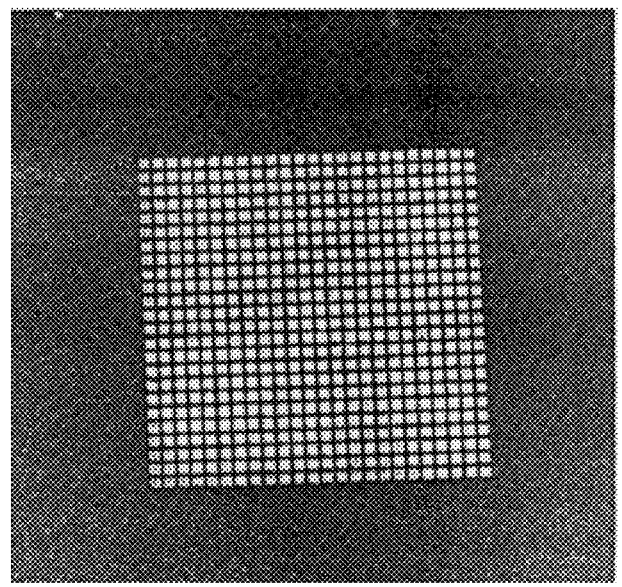
FIG. 6a shows a light-optical transmitted light print of a mask with mask fields manufactured according to the method according to the invention

FIG. 6a shows a mask manufactured according to the method described in a light-optical transmitted light print. The mask fields are bounded or framed by side walls standing perpendicular to the membrane.

Figure 6B:
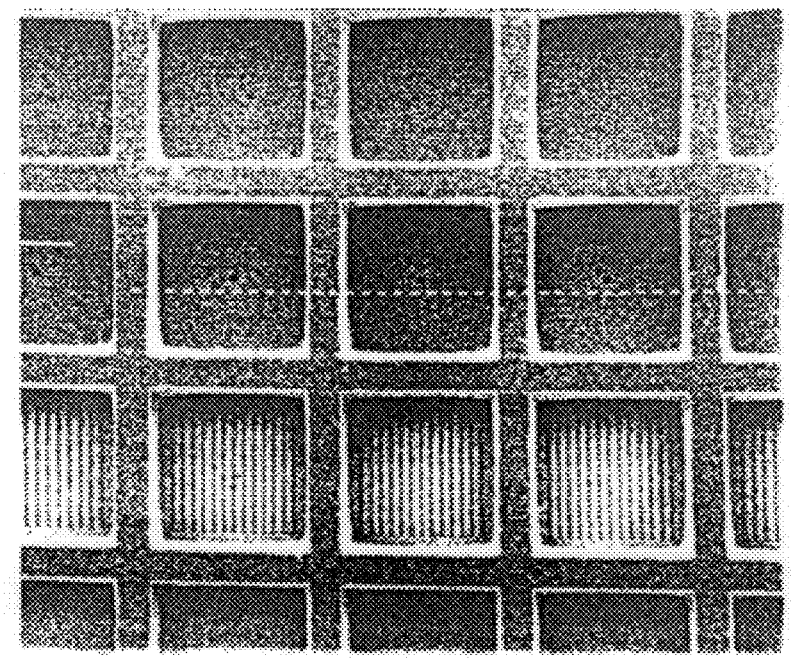
FIGS. 6b to 6d show electron-microscope prints of a mask with mask fields manufactured according to the method according to the invention
Figure 6C:
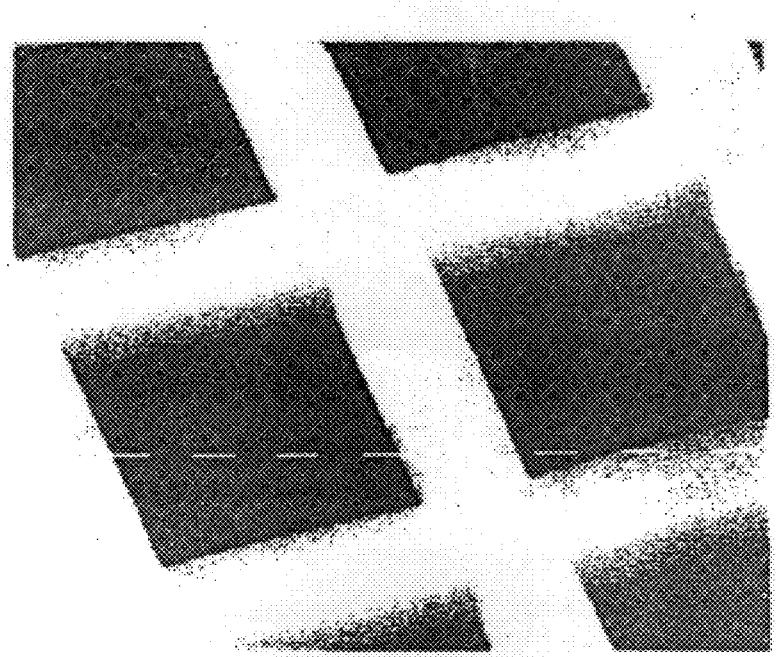
Figure 6D:
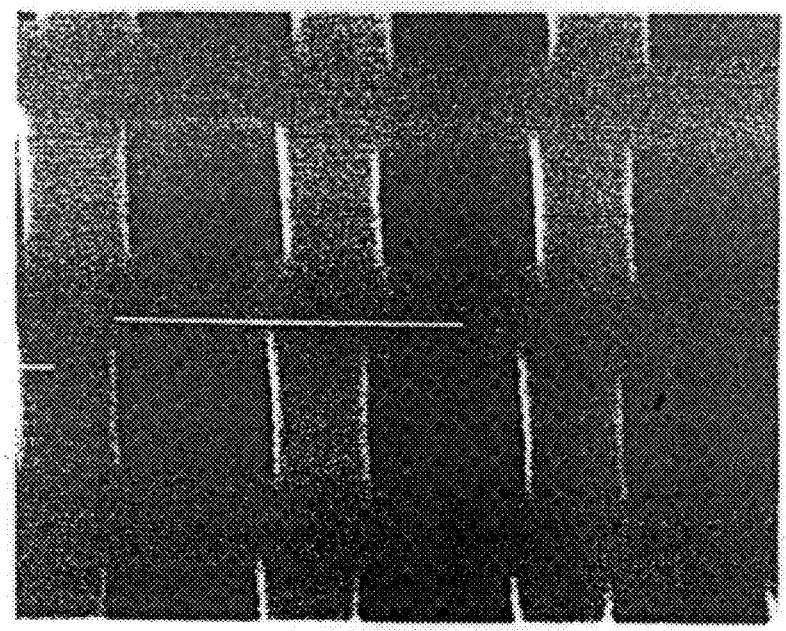

FIGS. 6b to 6d show electron-microscope prints of a section of the mask with some mask fields magnified to differing extents. The vertical side walls with a thickness in the sub-$\mu$m range are clearly recognizable.

We claim:

1. Method for the manufacture of a mask having mask fields and thin support walls formed from a single-crystal silicon substrate and covered by a membrane layer comprising the steps of:

forming said membrane layer on a top surface of said single-crystal silicon substrate having a substrate thickness of silicon remaining after said step of forming said membrane layer;

etching a set of apertures from a bottom surface of said silicon substrate by an anisotropic plasma etching process, said set of apertures being separated from one another by a set of aperture walls and having an aperture depth less than said substrate thickness by a tolerance thickness, thereby leaving a remainder layer of silicon between a bottom surface of said set of apertures and said membrane layer; and etching said remainder layer in a wet etch process until said membrane is exposed.

2. A method according to claim 1, characterized in that said anisotropic plasma etching process employs $SF_6$ chemistry and an alkaline solution is used for said wet-etching step.

3. A method according to claim 1, characterized in that said anisotropic plasma etching process employs $SF_6$ and oxygen chemistry.

4. A method according to claim 2, characterized in that said anisotropic plasma etching process employs $SF_6$ and oxygen chemistry.

5. A method according to claim 1, characterized in that said single crystal silicon substrate is disposed with the (100) crystal direction of said silicon substrate oriented perpendicular to said membrane.

6. A method according to claim 2, characterized in that said single crystal silicon substrate is disposed with the (100) crystal direction of said silicon substrate oriented perpendicular to said membrane.

7. A method according to claim 3, characterized in that said single crystal silicon substrate is disposed with the (100) crystal direction of said silicon substrate oriented perpendicular to said membrane.

8. A method according to claim 4, characterized in that said single crystal silicon substrate is disposed with the (100) crystal direction of said silicon substrate oriented perpendicular to said membrane.

9. A method according to claim 1, characterized in that said membrane layer comprises a material selected from the group consisting of: highly-doped silicon, silicon nitride, and a composite layer of $SiO_2/Si_3N_4/SiO_2$.

10. A method according to claim 2, characterized in that said membrane layer comprises a material selected from the group consisting of: highly-doped silicon, silicon nitride, and a composite layer of $SiO_2/Si_3N_4/SiO_2$.

11. A method according to claim 3, characterized in that said membrane layer comprises a material selected from the group consisting of: highly-doped silicon, silicon nitride, and a composite layer of $SiO_2/Si_3N_4/SiO_2$.

* * * * *